US009299685B2

(12) United States Patent
Kim

(10) Patent No.: US 9,299,685 B2
(45) Date of Patent: Mar. 29, 2016

(54) MULTI-CHIP PACKAGE HAVING A LOGIC CHIP DISPOSED IN A PACKAGE SUBSTRATE OPENING AND CONNECTING TO AN INTERPOSER

(71) Applicant: Samsung Electronics Co., Ltd., Suwon-si (KR)

(72) Inventor: Kil-Soo Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/451,520

(22) Filed: Aug. 5, 2014

(65) Prior Publication Data
US 2015/0035142 A1 Feb. 5, 2015

(30) Foreign Application Priority Data
Aug. 5, 2013 (KR) .................. 10-2013-0092482

(51) Int. Cl.
*H01L 25/065* (2006.01)
*H01L 23/13* (2006.01)
*H01L 23/498* (2006.01)
*H01L 23/31* (2006.01)
(Continued)

(52) U.S. Cl.
CPC ............ *H01L 25/0657* (2013.01); *H01L 23/13* (2013.01); *H01L 23/49822* (2013.01); *H01L 23/3128* (2013.01); *H01L 23/481* (2013.01); *H01L 23/49816* (2013.01); *H01L 24/16* (2013.01); *H01L 24/48* (2013.01); *H01L 25/18* (2013.01); *H01L 2224/02371* (2013.01); *H01L 2224/0557* (2013.01); *H01L 2224/05548* (2013.01); *H01L 2224/06181* (2013.01); *H01L 2224/16145* (2013.01); *H01L 2224/16146* (2013.01); *H01L 2224/16225* (2013.01); *H01L 2224/16227* (2013.01); *H01L 2224/32145* (2013.01); *H01L 2224/32225* (2013.01); *H01L 2224/48145* (2013.01); *H01L 2224/48227* (2013.01); *H01L 2224/48237* (2013.01);
(Continued)

(58) Field of Classification Search
CPC . H01L 25/0657; H01L 23/3107; H01L 24/09; H01L 24/17
USPC .................. 257/737, 686, 678, 685
See application file for complete search history.

(56) References Cited

U.S. PATENT DOCUMENTS 6,639,309 B2 * 10/2003 Wallace ............... 257/678
6,713,857 B1 3/2004 Tsai
(Continued)

FOREIGN PATENT DOCUMENTS

KR 10-2008-0067891 A 7/2008
KR 10-0887558 B 3/2009
(Continued)

*Primary Examiner* — Marc Armand
*Assistant Examiner* — Younes Boulghassoul
(74) *Attorney, Agent, or Firm* — Muir Patent Law, PLLC

(57) ABSTRACT

A multi-chip package may include a package substrate, a connecting substrate, a plurality of semiconductor chips and a logic chip. The package substrate may have an opening. The connecting substrate may be arranged on an upper surface of the package substrate. The semiconductor chips may be stacked on an upper surface of the connecting substrate. The semiconductor chips may be electrically connected with the connecting substrate. The logic chip may be arranged in the opening. The logic chip may be electrically connected between the connecting substrate and the package substrate. Thus, the logic chip may not act as to increase a width of the multi-chip package.

5 Claims, 14 Drawing Sheets

(51) Int. Cl.
*H01L 25/18* (2006.01)
*H01L 23/00* (2006.01)
*H01L 23/48* (2006.01)

(52) U.S. Cl.
CPC ............ *H01L2224/49109* (2013.01); *H01L 2224/73257* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06527* (2013.01); *H01L 2225/06541* (2013.01); *H01L 2225/06551* (2013.01); *H01L 2225/06562* (2013.01); *H01L 2225/06565* (2013.01); *H01L 2924/15151* (2013.01); *H01L 2924/15153* (2013.01); *H01L 2924/15311* (2013.01); *H01L 2924/19107* (2013.01)

(56) References Cited

U.S. PATENT DOCUMENTS

| | | | |
|---|---|---|---|
| 7,417,322 B2 | 8/2008 | Kang | |
| 7,554,185 B2 * | 6/2009 | Foong et al. | 257/686 |
| 7,723,833 B2 * | 5/2010 | Mehta | H01L 25/0657 257/686 |
| 2004/0212068 A1 * | 10/2004 | Wang | H01L 24/49 257/686 |
| 2007/0158821 A1 | 7/2007 | Szewerenko et al. | |
| 2008/0023816 A1 * | 1/2008 | Weng | H01L 23/3128 257/690 |
| 2008/0150110 A1 * | 6/2008 | Kim | H01L 23/13 257/685 |
| 2008/0315406 A1 * | 12/2008 | Chung et al. | 257/723 |
| 2010/0224976 A1 * | 9/2010 | Silvestri | H01L 25/18 257/686 |
| 2010/0265751 A1 * | 10/2010 | Hong | 365/51 |
| 2013/0021760 A1 * | 1/2013 | Kim | H01L 25/0657 361/729 |
| 2013/0049228 A1 | 2/2013 | Nam et al. | |
| 2013/0127070 A1 | 5/2013 | Jung et al. | |

FOREIGN PATENT DOCUMENTS

| | | |
|---|---|---|
| KR | 10-2011-0124064 A | 11/2011 |
| KR | 10-2011-0124065 A | 11/2011 |

* cited by examiner

MULTI-CHIP PACKAGE HAVING A LOGIC CHIP DISPOSED IN A PACKAGE SUBSTRATE OPENING AND CONNECTING TO AN INTERPOSER

CROSS-RELATED APPLICATION

This application claims priority under 35 USC §119 to Korean Patent Application No. 10-2013-0092482, filed on Aug. 5, 2013 in the Korean Intellectual Property Office (KIPO), the contents of which are herein incorporated by reference in their entirety.

BACKGROUND

1. Field

This disclosure relates to a multi-chip package. More particularly, this disclosure relates to a multi-chip package including sequentially stacked semiconductor chips.

2. Description of the Related Art

Generally, various semiconductor fabrication processes may be performed on a semiconductor substrate to form a plurality of semiconductor chips. In order to mount the semiconductor chips on a printed circuit board (PCB), a packaging process may be performed on the semiconductor chip to form a semiconductor package.

In order to increase storage capacity of the semiconductor package, a multi-chip package can include the sequentially stacked semiconductor chips. The multi-chip package may include a package substrate, the semiconductor chips sequentially stacked on the package substrate, a logic chip arranged on the package substrate, and conductive wires electrically connected between the semiconductor chips, the logic chip, and the package substrate.

According to related art, a bond finger may be formed on an upper surface of the package substrate outside the logic chip. Thus, the multi-chip package may have a wide width.

In contrast, in order to decrease the width of the multi-chip package, the logic chip may be arranged closely to a lowermost semiconductor chip. Therefore, a gap between the lowermost semiconductor chip and the logic chip may be narrow. However, because a molding member may not be sufficiently supplied to the narrow space, voids may be generated in the molding member.

In certain arrangements, the logic chip may be arranged in a thick die attach film interposed between a semiconductor chip and the package substrate to decrease the width of the multi-chip package. However, the thick die attach film may act as to increase a thickness of the multi-chip package.

SUMMARY

Example embodiments provide a multi-chip package having a narrower width and a thinner thickness.

According to example embodiments, there may be provided a multi-chip package. The multi-chip package may include a package substrate, a connecting substrate, a plurality of semiconductor chips and a logic chip. The package substrate may have an opening. The connecting substrate may be arranged on an upper surface of the package substrate. The semiconductor chips may be stacked on an upper surface of the connecting substrate. The semiconductor chips may be electrically connected with the connecting substrate. The logic chip may be arranged in the opening. The logic chip may be electrically connected between the connecting substrate and the package substrate.

In example embodiments, the connecting substrate may include a first connecting pad electrically connected to the semiconductor chips, and a second connecting pad electrically connected to the first connecting pad. The second connecting pad may be exposed through the opening. The second connecting pad may be electrically connected to the logic chip.

In example embodiments, the logic chip may include a logic pad electrically connected between the connecting substrate and the package substrate.

In example embodiments, the logic pad may be arranged on a lower surface of the logic chip.

In example embodiments, the multi-chip package may further include a first connecting wire electrically connected between the logic pad and the connecting substrate, and a second connecting wire electrically connected between the logic pad and the package substrate.

In example embodiments, the semiconductor chips may include bonding pads arranged on upper surfaces of the semiconductor chips. The bonding pads may be electrically connected with the connecting substrate.

In example embodiments, the multi-chip package may further include a conductive wire electrically connected between each bonding pad and the connecting substrate.

In example embodiments, the semiconductor chips may be stacked in a step-like shape.

In example embodiments, the multi-chip package may further include an underfilling layer formed in the opening.

According to other example embodiments, there may be provided a multi-chip package. The multi-chip package may include a package substrate, a plurality of semiconductor chips, a logic chip and a connecting bump. The package substrate may have an opening. The semiconductor chips may be stacked on an upper surface of the package substrate. The semiconductor chips may include bonding pads arranged on lower surfaces of the semiconductor chips. The logic chip may be arranged in the opening. The logic chip may be electrically connected with the package substrate. The connecting bump may be electrically connected between the logic chip and the bonding pads.

In example embodiments, the multi-chip package may further include plugs formed in the semiconductor chips to electrically connect the bonding pads with each other.

In example embodiments, the multi-chip package may further include a vertical connecting line formed on outer side surfaces of the semiconductor chips to electrically connect the bonding pads with each other.

In example embodiments, the multi-chip package may further include an underfilling layer formed in the opening.

According to example embodiments, the logic chip may be positioned in the opening of the package substrate. Further, the logic chip may be electrically connected with the semiconductor chips via the connecting substrate. Thus, the logic chip may not act as to increase a width of the multi-chip package. As a result, the multi-chip package may have a narrow width and a thin thickness.

In further example embodiments, a multi-chip package includes a package substrate including an opening therein, a stack of semiconductor chips disposed on the package substrate, a logic chip disposed in the opening and on the stack of semiconductor chips, and a first logic pad on a surface of the logic chip and electrically connected to a second pad located at the opening. The second pad may be electrically connected to the stack of semiconductor chips.

In example embodiments, an interposer is disposed between the package substrate and the stack of semiconductor chips, and between the logic chip and the stack of semiconductor chips.

In example embodiments, a pad is disposed on a bottom surface of the interposer and directly electrically connected to the logic chip, and a pad is disposed on a top surface of the interposer and directly electrically connected to at least a first of the semiconductor chips of the stack of semiconductor chips.

The multi-chip package may further include a pad on a top surface of the interposer that is directly electrically connected to the package substrate.

In certain embodiment, the multi-chip package additionally includes a pad on a top surface of the substrate that is directly electrically connected to at least a second of the semiconductor chips of the stack of semiconductor chips.

In one embodiment, the second pad located at the opening is the same pad as the pad on the bottom surface of the interposer.

In one embodiment, the stack of semiconductor chips comprise a first group of semiconductor chips and a second group of semiconductor chips; wherein: the first group of semiconductor chips is directly electrically connected to the interposer, and the second group of semiconductor chips is directly electrically connected to the package substrate.

BRIEF DESCRIPTION OF THE DRAWINGS

Example embodiments will be more clearly understood from the following detailed description taken in conjunction with the accompanying drawings.

FIG. 1 is a cross-sectional view illustrating a multi-chip package in accordance with example embodiments;

FIG. 2 is an enlarged cross-sectional view of a portion "II" in FIG. 1;

FIG. 3 is a cross-sectional view illustrating a multi-chip package in accordance with example embodiments;

FIG. 4 is an enlarged cross-sectional view of a portion "IV" in FIG. 3;

FIG. 5 is a cross-sectional view illustrating a multi-chip package in accordance with example embodiments;

FIG. 6 is a cross-sectional view illustrating a multi-chip package in accordance with example embodiments;

FIG. 7 is a cross-sectional view illustrating a multi-chip package in accordance with example embodiments;

FIG. 8 is a cross-sectional view illustrating a multi-chip package in accordance with example embodiments;

FIG. 9 is a cross-sectional view illustrating a multi-chip package in accordance with example embodiments;

FIG. 10 is a cross-sectional view illustrating a multi-chip package in accordance with example embodiments;

FIG. 11 is a cross-sectional view illustrating a multi-chip package in accordance with example embodiments;

FIG. 12 is a cross-sectional view illustrating a multi-chip package in accordance with example embodiments;

FIG. 13 is a cross-sectional view illustrating a multi-chip package in accordance with example embodiments; and FIG. 14 is a cross-sectional view illustrating a multi-chip package in accordance with example embodiments.

DETAILED DESCRIPTION

Figure 1:
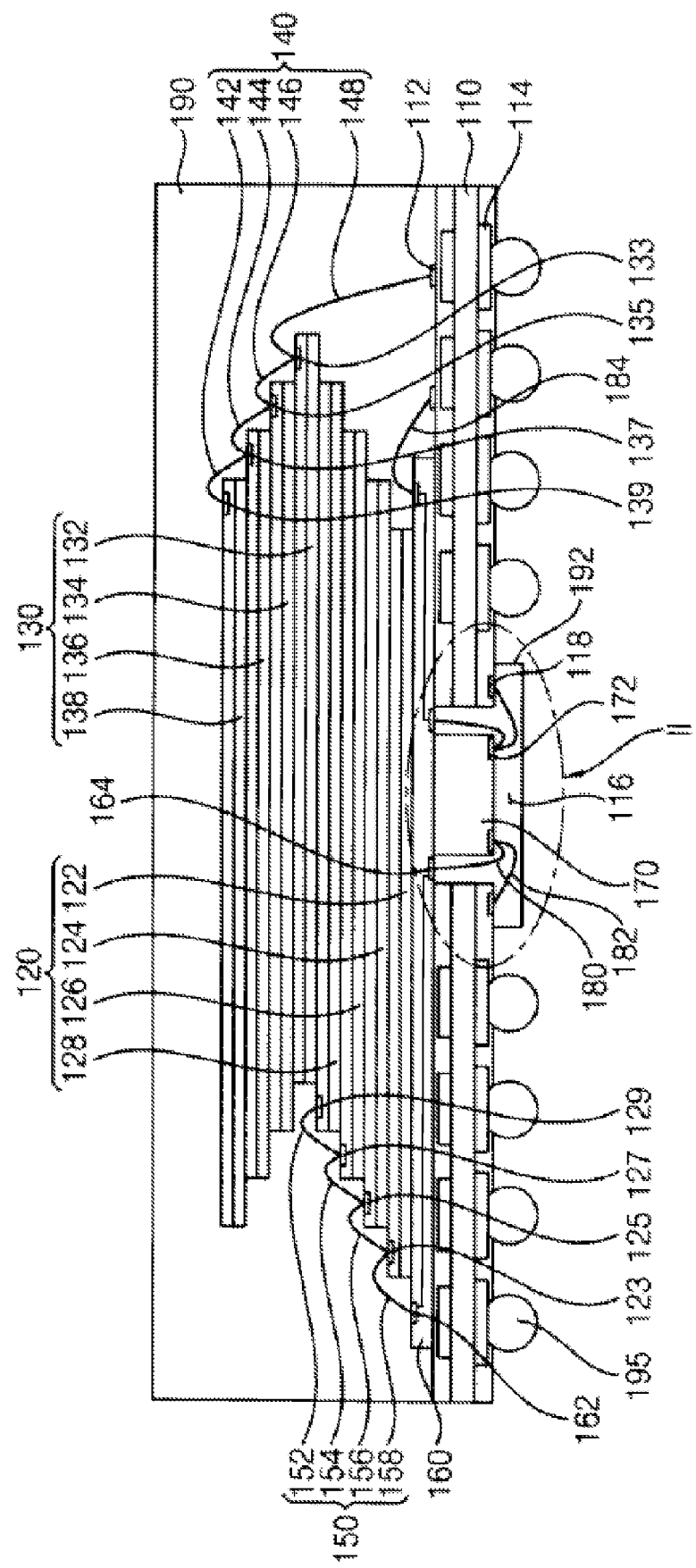
FIGS. 1 to 14 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. A similar concept applies to other words, such as "adjacent to" or "between."

Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present invention.

Terms such as "same," "flat," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The term "contact," as used herein, implies a direct contact, unless indicated otherwise.

The term "directly electrically connected," as used herein refers to an electrical connection through only inactive conductive elements, such as wires, conductive pads, conductive through vias, solder balls, and the like. Such a connection would not apply to two elements connected, for example, through a transistor that is at times on and at times off.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
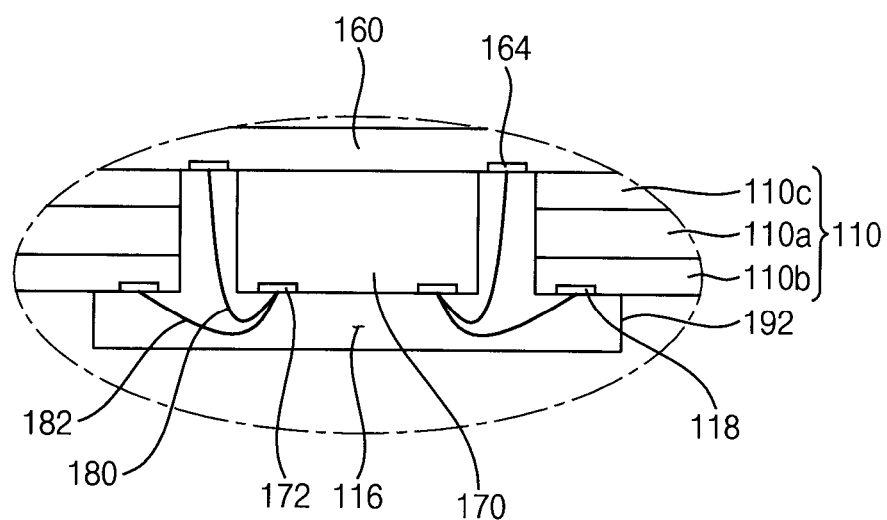

FIG. 1 is a cross-sectional view illustrating a multi-chip package in accordance with example embodiments, and FIG. 2 is an enlarged cross-sectional view of a portion "II" in FIG. 1.

Referring to FIGS. 1 and 2, a multi-chip package 100 of this example embodiment may include a package substrate 110, a first group of semiconductor chips 120, a second group of semiconductor chips 130, a connecting substrate 160, a logic chip 170, first conductive wires 140, second conductive wires 150, first connecting wires 180, second connecting wires 182, a molding member 190, an underfilling layer 192 and external terminals 195.

The package substrate 110 may include, for example, an insulating a core substrate 110a, and build-up portions 110b and 110c below and above the core substrate respectively (e.g., lower build-up and upper build-up portions). For example, the package substrate 110 may include one or more upper conductive terminals including, for example, one or more upper bond fingers 112, one or more lower conductive terminals including, for example, one or more lower bond fingers 118 and one or more ball lands 114. The upper bond fingers 112, lower bond fingers 118, and ball lands 114 may be formed, for example, in or on the buildup portions 110b and 110c. At least a first upper bond finger 112 may be arranged on an upper surface of the package substrate 110 (e.g., at an upper surface of buildup portion 110c). At least a first ball land 114 may be arranged at a lower portion of the package substrate 110 (e.g., on a lower surface of the core substrate 110a). Though not shown, in one embodiment, the package substrate 110 includes a circuit electrically connected between the upper bond finger 112 and the ball land 114. The circuit may pass a signal between the upper bond finger 112 and the ball land 114, and may include, for example, internal wires and redistribution lines, and/or through vias, passing through one or more of core substrate 110a and build-up portions 110b and 110c.

Though a single bond upper bond finger 112, lower bond finger 118, ball land 114, and other elements are discussed in particular herein, these are discussed to serve as examples for the multi-chip package 100, and there may be a plurality of respective terminals in the multi-chip package 100 discussed herein, connected in similar manners as the examples described herein.

In example embodiments, the package substrate 110 may have an opening 116. The opening 116 may be vertically formed through a central portion of the package substrate 110 (e.g., a central portion as viewed from above). The lower bond finger 118 may be arranged on a central portion of the lower surface of the package substrate 110 adjacent to the opening 116. For example, the lower bond finger 118 may be located at an edge portion of the package substrate 110 adjacent the opening 116, outside of an area that includes the ball lands 114 and external terminals 195 as viewed in the cross-sectional representation of FIG. 1.

The connecting substrate 160 may be arranged on the upper surface of the package substrate 110. In one embodiment, the connecting substrate 160 includes one or more first connecting pads 162 and one or more second connecting pads 164. Each first connecting pad 162 may be arranged on an edge portion of an upper surface of the connecting substrate 160. Each second connecting pad 164 may be arranged on a central portion of a lower surface of the connecting substrate 160. In one embodiment, the second connecting pads 164 are exposed through the opening 116 of the package substrate 110 and are adjacent an inside edge of the package substrate 110. In example embodiments, the connecting substrate 160 may include an insulating tape having a thin thickness such as a laminate tape.

The first group of the semiconductor chips 120 may be stacked on the upper surface of the connecting substrate 160. In example embodiments, the first group of the semiconductor chips 120 includes a first semiconductor chip 122, a second semiconductor chip 124, a third semiconductor chip 126 and a fourth semiconductor chip 128. The first semiconductor chip 122 may be placed on the upper surface of the connecting substrate 160 (e.g., directly adjacent to the connecting substrate 160 without any other chips therebetween). The second semiconductor chip 124 may be placed on an upper surface of the first semiconductor chip 122. The third semiconductor chip 126 may be placed on an upper surface of the second semiconductor chip 124. The fourth semiconductor chip 128 may be placed on an upper surface of the third semiconductor chip 126. In certain embodiments, the first semiconductor chip 122, the second semiconductor chip 124, the third semiconductor chip 126 and the fourth semiconductor chip 128 may have substantially the same size. In addition, in certain embodiments, the first through fourth semiconductor chips 122-128 may all be the same type of chip, such as a memory chip. Each chip may be connected to its directly adjacent chips using, for example, an insulative adhesive. The first semiconductor chip 122 may have a first set of bonding pads including first bonding pad 123. The second semiconductor chip 124 may have a second set of bonding pads including second bonding pad 125. The third semiconductor chip 126 may have a third set of bonding pads including third bonding pad 127. The fourth semiconductor chip 128 may have a fourth set of bonding pads including fourth bonding pad 129. The first bonding pad 123 may be positioned on a left edge portion of the upper surface of the first semiconductor chip 122 (e.g., when viewed as the cross-section shown in FIG. 1). The second bonding pad 125 may be positioned on a left edge portion of the upper surface of the second semiconductor chip 124. The third bonding pad 127 may be positioned on a left edge portion of the upper surface of the third semiconductor chip 126. The fourth bonding pad 129 may be positioned on a left edge portion of an upper surface of the fourth semiconductor chip 128.

In example embodiments, the first semiconductor chip 122, the second semiconductor chip 124, the third semiconductor chip 126 and the fourth semiconductor chip 128 may be stacked in a steplike shape. Thus, a right side surface of the second semiconductor chip 124 may protrude from a right side surface of the first semiconductor chip 122 in a first horizontal direction (e.g., it may overhang past the right end of the first semiconductor chip 122). A right side surface of the third semiconductor chip 126 may protrude from the right side surface of the second semiconductor chip 124 in the first horizontal direction (e.g., it may overhang past the right end of the second semiconductor chip 124). A right side surface of the fourth semiconductor chip 128 may protrude from the right side surface of the third semiconductor chip 126 in the first horizontal direction (e.g., it may overhang past the right end of the third semiconductor chip 126). As a result, the first bonding pad 123, the second bonding pad 125, the third bonding pad 127 and the fourth bonding pad 129, which may be arranged on the left edge portions of the first semiconductor chip 122, the second semiconductor chip 124, the third semiconductor chip 126 and the fourth semiconductor chip 128, may be upwardly exposed. Each bonding pad 123, 125, 127, and 129 connects to internal circuitry of the respective semiconductor chip on which it is disposed, so that it may send and receive signals to and from the respective semiconductor chip.

The second group of the semiconductor chips 130 may be stacked on the upper surface of the first group of the semiconductor chips 120. In example embodiments, the second group of the semiconductor chips 130 includes a fifth semiconductor chip 132, a sixth semiconductor chip 134, a seventh semiconductor chip 136 and an eighth semiconductor chip 138. The fifth semiconductor chip 132 may be placed on the upper surface of the fourth semiconductor chip 128 (e.g., it may be directly adjacent to the fourth semiconductor chip 128). The sixth semiconductor chip 134 may be placed on an upper surface of the fifth semiconductor chip 132. The seventh semiconductor chip 136 may be placed on an upper surface of the sixth semiconductor chip 134. The eighth semiconductor chip 138 may be placed on an upper surface of the seventh semiconductor chip 136. In one embodiment, the fifth semiconductor chip 132, the sixth semiconductor chip 134, the seventh semiconductor chip 136 and the eighth semiconductor chip 138 may have substantially the same size. Further, the size of the fifth semiconductor chip 132, the sixth semiconductor chip 134, the seventh semiconductor chip 136 and the eighth semiconductor chip 138 may be substantially the same as that of the first semiconductor chip 122, the second semiconductor chip 124, the third semiconductor chip 126 and the fourth semiconductor chip 128. In addition, in certain embodiments, the fifth through eighth semiconductor chips 132-138 may all be the same type of chip, such as a memory chip. Each chip of the second group of chips 130 may be the same type of chip as the chips in the first group of chips 120. The fifth semiconductor chip 132 may have a fifth set of bonding pads including a fifth bonding pad 133. The sixth semiconductor chip 134 may have a sixth set of bonding pads including a sixth bonding pad 135. The seventh semiconductor chip 136 may have a seventh set of bonding pads including a seventh bonding pad 137. The eighth semiconductor chip 138 may have an eighth set of bonding pads including a eighth bonding pad 139. The fifth bonding pad 133 may be positioned on a right edge portion of the upper surface of the fifth semiconductor chip 132. The sixth bonding pad 135 may be positioned on a right edge portion of the upper surface of the sixth semiconductor chip 134. The seventh bonding pad 137 may be positioned on a right edge portion of the upper surface of the seventh semiconductor chip 136. The eighth bonding pad 139 may be positioned on a right edge portion of an upper surface of the eighth semiconductor chip 138. Each bonding pad 133, 135, 137, and 139 connects to internal circuitry of the respective semiconductor chip on which it is disposed, so that it may send and receive signals to and from the respective semiconductor chip In example embodiments, the fifth semiconductor chip 132, the sixth semiconductor chip 134, the seventh semiconductor chip 136 and the eighth semiconductor chip 138 may be stacked in a steplike shape. Further, the fifth semiconductor chip 132, the sixth semiconductor chip 134, the seventh semiconductor chip 136 and the eighth semiconductor chip 138 may be stacked in a third horizontal direction substantially opposite to the first horizontal direction. For example, the eight semiconductor chips may form a zig-zag pattern. Thus, a left side surface of the sixth semiconductor chip 134 may protrude from a left side surface of the fifth semiconductor chip 132 in the third horizontal direction (e.g., it may extend past a left end of the fifth semiconductor chip 132, as viewed from the cross-sectional angle shown in FIG. 1). A left side surface of the seventh semiconductor chip 136 may protrude from the left side surface of the sixth semiconductor chip 134 in the third horizontal direction (e.g., it may extend past a left end of the sixth semiconductor chip 134, as viewed from the cross-sectional angle shown in FIG. 1). A left side surface of the eighth semiconductor chip 138 may protrude from the left side surface of the seventh semiconductor chip 136 in the third horizontal direction (e.g., it may extend past a left end of the sixth semiconductor chip 136, as viewed from the cross-sectional angle shown in FIG. 1). As a result, the fifth bonding pad 133, the sixth bonding pad 135, the seventh bonding pad 137 and the eighth bonding pad 139, which may be arranged on the right edge portions of the fifth semiconductor chip 132, the sixth semiconductor chip 134, the seventh semiconductor chip 136 and the eighth semiconductor chip 138, may be upwardly exposed.

The first conductive terminal 140 may electrically connect the second group of semiconductor chips 130 with the upper bond finger 112 of the package substrate 110. In example embodiments, the first conductive terminal 140 may include a 1-1 conductive wire 142, a 1-2 conductive wire 144, a 1-3 conductive wire 146 and a 1-4 conductive wire 148. The 1-1 conductive wire 142 may be electrically connected between the eighth bonding pad 139 of the eighth semiconductor chip 138 and the seventh bonding pad 137 of the seventh semiconductor chip 136. The 1-2 conductive wire 144 may be electrically connected between the seventh bonding pad 137 of the seventh semiconductor chip 136 and the sixth bonding pad 135 of the sixth semiconductor chip 134. The 1-3 conductive wire 146 may be electrically connected between the sixth bonding pad 135 of the sixth semiconductor chip 134 and the fifth bonding pad 133 of the fifth semiconductor chip 132. The 1-4 conductive wire 148 may be electrically connected between the fifth bonding pad 133 of the fifth semiconductor chip 132 and the upper bond finger 112 of the package substrate 110. The upper bond finger 112 may be electrically connected with the first connecting pad 162 of the connecting substrate 160 via a third connecting wire 184 that connects to another pad on the package substrate 110 (and via internal circuitry (not shown) of package substrate 110). Therefore, the first group of the semiconductor chips 130 may be electrically connected with the connecting substrate 160 through the package substrate 110.

Alternatively, the 1-4 conductive wire 148 may be connected to any one of the sixth bonding pad 135, the seventh bonding pad 137 and the eighth bonding pad 139. Further, when the connecting substrate 160 has a portion protruding past a right end of the fifth semiconductor chip 132, the 1-4 conductive wire 148 may be directly connected to a first connecting pad 162 of the connecting substrate 160.

The second conductive terminal 150 may directly connect the first group of the semiconductor chip 120 with the first connecting pad 162 of the connecting substrate 160. In example embodiments, the second conductive terminal 150 includes a 2-1 conductive wire 152, a 2-2 conductive wire 154, a 2-3 conductive wire 156 and a 2-4 conductive wire 158. The 2-1 conductive wire 152 may be electrically connected between the fourth bonding pad 129 of the fourth semiconductor chip 128 and the third bonding pad 127 of the third semiconductor chip 126. The 2-2 conductive wire 154 may be electrically connected between the third bonding pad 127 of the third semiconductor chip 126 and the second bonding pad 125 of the second semiconductor chip 124. The 2-3 conductive wire 156 may be electrically connected between the second bonding pad 125 of the second semiconductor chip 124 and the first bonding pad 123 of the first semiconductor chip 122. The 2-4 conductive wire 158 may be electrically connected between the first bonding pad 123 of the first semiconductor chip 122 and the first connecting pad 162 of the connecting substrate 160.

Alternatively, the 2-4 conductive wire 158 may be connected to any one of the second bonding pad 125, the third bonding pad 127 and the fourth bonding pad 129. In the embodiment shown, the 2-4 conductive wire 158 directly connects to a first connecting pad 162 on the connecting substrate 160, without connecting through the package substrate 160.

The logic chip 170 may be positioned in the opening 116 of the package substrate 110. Because the logic chip 170 may be placed in the opening 116, the logic chip 170 may not act as to increase the width of the multi-chip package 100. Further, because the connecting substrate 160 may have the thin thickness, the connecting substrate 160 may hardly act as to increase the thickness of the multi-chip package 100. In example embodiments, the logic chip 170 may include a control chip, a buffer chip, or other chip including logic circuitry, etc., for controlling and/or improving operational characteristics of the multi-chip package 100.

In example embodiments, the connecting substrate 160 is therefore disposed between the logic chip and the stack of semiconductor chips 122-138. In one embodiment, the connecting substrate 160 does not include active elements, and merely acts as a conduit to pass signals between the logic chip and the semiconductor chips 122-138. For example, the connecting substrate 160 may pass signals received from the package substrate 110 via an upper bond finger 112, wire 184, and first connecting pad 162 through internal circuitry (not shown) to a second connecting pad 164 that connects to wire 180 to transmit the signal to the logic chip 170 via a logic pad 172. Similarly, the connecting substrate 160 may pass signals received from certain logic chips (e.g., 120) at a first connecting pad 162 to a second connecting pad 164 through internal circuitry (not shown), which then transmits the signal through a first wire 180 to logic chip 170 via a logic pad 172. Therefore, the connecting substrate may serve as an interposer, or a rerouting substrate.

In example embodiments, the logic chip 170 includes a logic pad 172. The logic pad 172 may be arranged, for example, on an edge portion of a lower surface of the logic chip 170. In one embodiment, the lower surface of the logic chip 170 corresponds to an active face of the logic chip 170.

The first connecting wire 180 may be electrically connected between the logic pad 172 of the logic chip 170 and the second connecting pad 164 of the connecting substrate 160. The second connecting wire 182 may be electrically connected between the logic pad 172 of the logic chip 170 and the lower bond finger 118 of the package substrate 110.

The underfilling layer 192 may be formed in the opening 116 of the package substrate 110 to cover the logic chip 170, the first connecting wire 180 and the second connecting wire 182. In example embodiments, the underfilling layer 192 may have a lower surface downwardly protruded from the lower surface of the package substrate 110. The underfill layer may be composed of, for example, an insulative material.

The molding member 190 may be formed on the upper surface of the package substrate 110 to cover the first group of the semiconductor chips 120 and the second group of the semiconductor chip 130. The molding member 190 may protect the first group of the semiconductor chips 120, the second group of the semiconductor chips 130, the first conductive wire 140 and the second conductive wire 150 from external environments. In example embodiments, the molding member 190 may include an insulative material, such as for example an epoxy molding compound (EMC).

The external terminals 195 may be mounted on the ball land 114 of the package substrate 110. In example embodiments, the external terminals 195 may include solder balls.

In example embodiments, each of the first group of the semiconductor chips 120 and the second group of the semiconductor chips 130 may include the four semiconductor chips. Alternatively, each group of the semiconductor chips may include a different number of semiconductor chips, such as at least two semiconductor chips.

Further, the semiconductor chips may be stacked in the steplike shape along the two horizontal directions. Alternatively, the semiconductor chips may be stacked in a steplike shape along a single horizontal direction.

Figure 3:
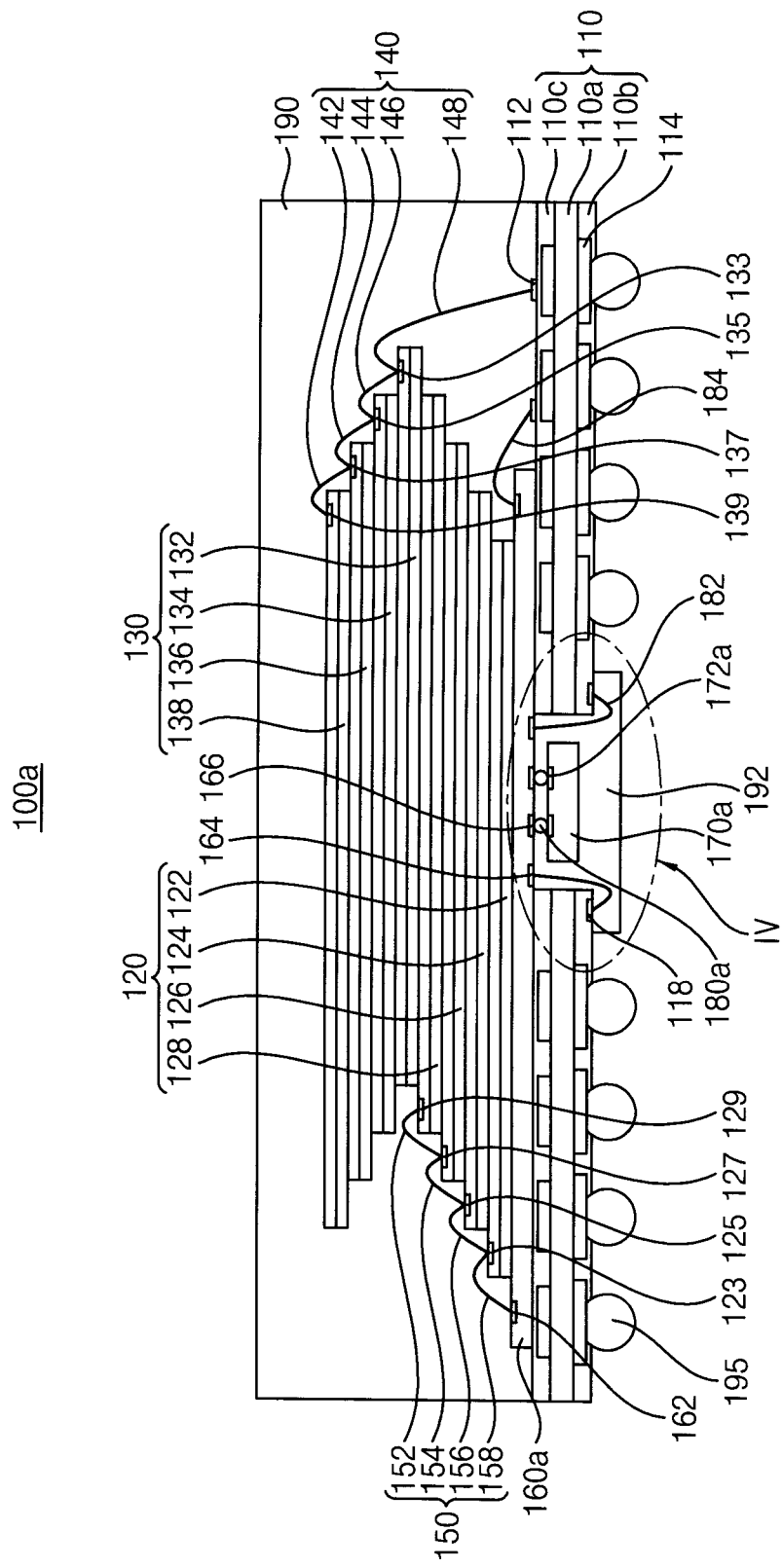
Figure 4:
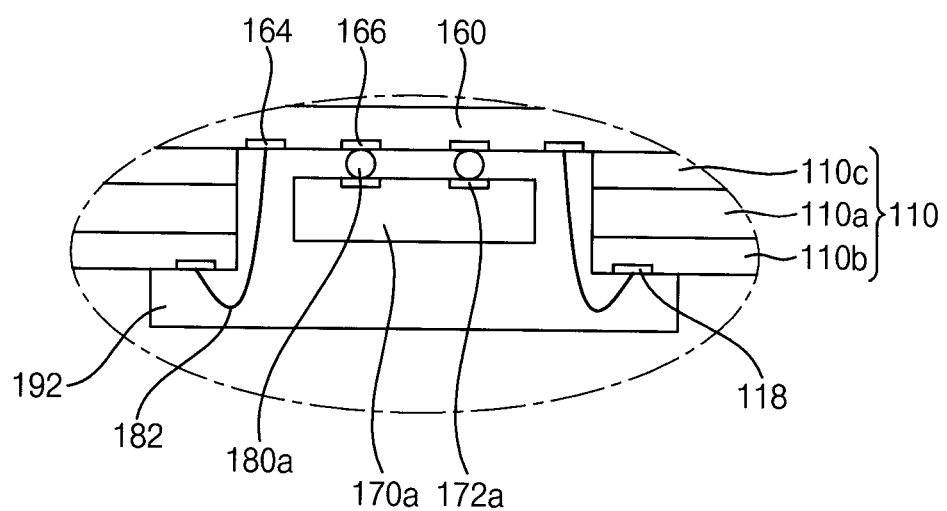

FIG. 3 is a cross-sectional view illustrating a multi-chip package in accordance with example embodiments, and FIG. 4 is an enlarged cross-sectional view of a portion "IV" in FIG. 3.

A multi-chip package 100a of this example embodiment may include elements substantially the same as those of the multi-chip package 100 in FIG. 1 except for a logic chip, the connecting substrate 160a, and their connections to the rest of the multi-chip package 100a. Thus, the same reference numerals may refer to the same elements and any further illustrations with respect to the same elements may be omitted herein for brevity.

Referring to FIGS. 3 and 4, a logic chip 170a may include a logic pad 172a arranged on an upper surface of the logic chip 170a. Thus, the upper surface of the logic chip 170a may correspond to an active face of the logic chip 170a.

A conductive bump 180a may be interposed between the logic chip 170a and the connecting substrate 160a. The conductive bump 180a may be electrically connected between the logic pad 172a of the logic chip 170a and a third connecting pad 166 of the connecting substrate 160a. The third connecting pad 166 may be electrically connected with the second connecting pad 164 (e.g., through internal circuitry and/ or wiring within the connecting substrate 160a. The second connecting wire 182 may be electrically connected between the second connecting pad 164 and the lower bond finger 118 of the package substrate 110.

Figure 5:
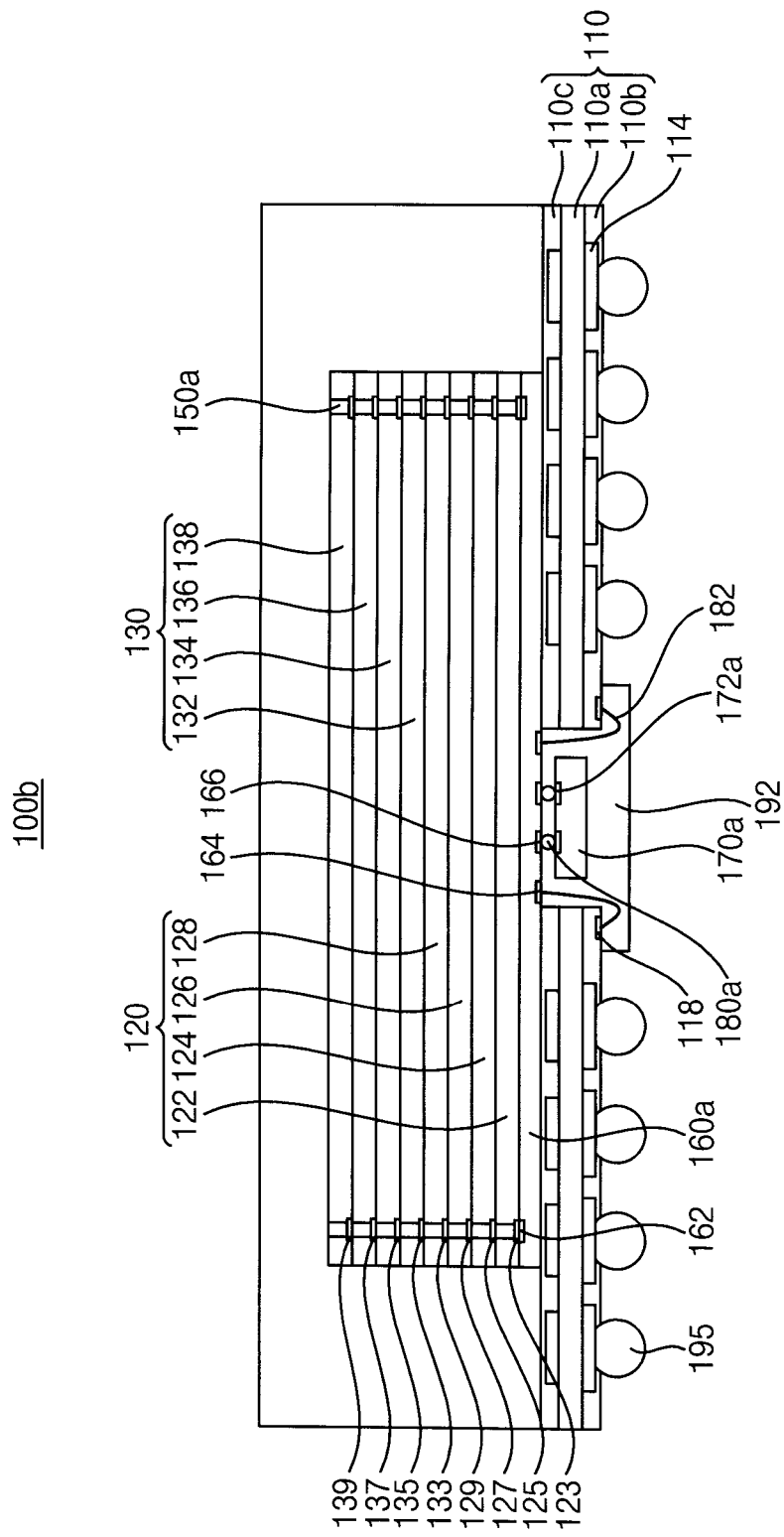

FIG. 5 is a cross-sectional view illustrating a multi-chip package in accordance with example embodiments.

A multi-chip package 100b of this example embodiment may include certain elements substantially the same as those of the multi-chip package 100a in FIG. 3. However, other elements, such as the stacking of the semiconductor chips 120 and 130 and plugs in place of conductive wires are different. Thus, the same reference numerals may refer to the same elements and any further illustrations with respect to the same elements may be omitted herein for brevity.

Referring to FIG. 5, the first group of the semiconductor chips 120 and the second group of the semiconductor chips 130 may not be stacked in the steplike shape. Instead, in one embodiment, semiconductor chips having the same sizes may be stacked to be vertically aligned. Thus, the first bonding pad 123, the second bonding pad 125, the third bonding pad 127, the fourth bonding pad 129, the fifth bonding pad 133, the sixth bonding pad 135, the seventh bonding pad 137 and the eighth bonding pad 139 may be positioned on substantially a same vertical line. Further, the first bonding pad 123, the second bonding pad 125, the third bonding pad 127, the fourth bonding pad 129, the fifth bonding pad 133, the sixth bonding pad 135, the seventh bonding pad 137 and the eighth bonding pad 139 may be arranged on the lower surfaces of the first and second groups of the semiconductor chips 120 and 130. Therefore, the first and second groups of the semiconductor chips 120 and 130 may correspond to face-down type semiconductor chips (e.g. wherein an active surface is face down).

A plug 150a may be vertically formed in the first and second groups of the semiconductor chips 120 and 130. The plug 150a may be electrically connected between the first bonding pad 123, the second bonding pad 125, the third bonding pad 127, the fourth bonding pad 129, the fifth bonding pad 133, the sixth bonding pad 135, the seventh bonding pad 137 and the eighth bonding pad 139 of the first and second groups of the semiconductor chips 120 and 130. For example, the plug 150a may be a conductive, through-substrate via that passes through the stack of chips and electrically connects to the bonding pads 123, 125, 127, 129, 133, 135, 137, and 139. The plug 150a may be a single plug, for example, passing through an inside of the bonding pads, or may be a set of stacked plugs, each plug included in a respective semiconductor chip and each plug having one end contacting a plug, and one end ending at an opposite surface of the semiconductor chip.

Figure 6:
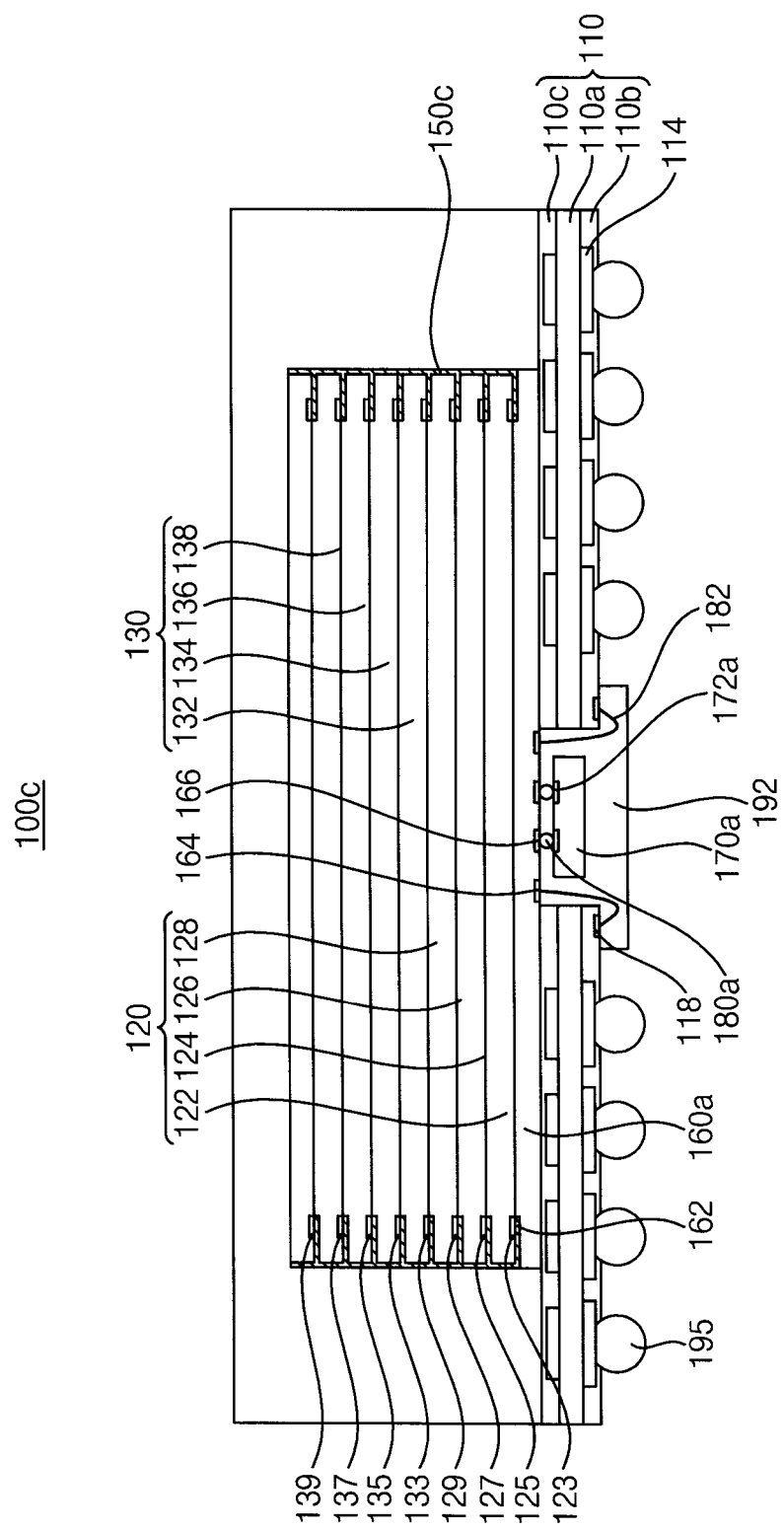

FIG. 6 is a cross-sectional view illustrating a multi-chip package in accordance with example embodiments.

A multi-chip package 100c of this example embodiment may include elements substantially the same as those of the multi-chip package 100b in FIG. 5 except for certain features, such as including a vertical connecting line in place of a plug. Thus, the same reference numerals may refer to the same elements and any further illustrations with respect to the same elements may be omitted herein for brevity.

Referring to FIG. 6, a vertical connecting line 150c may be formed on the outer side surfaces of the first and second groups of the semiconductor chips 120 and 130. The vertical connecting line 150c may be electrically connected between the first bonding pad 123, the second bonding pad 125, the third bonding pad 127, the fourth bonding pad 129, the fifth bonding pad 133, the sixth bonding pad 135, the seventh bonding pad 137 and the eighth bonding pad 139 of the first and second groups of the semiconductor chips 120 and 130. For example, the vertical connecting line 150c may connect to each bonding pad using a redistribution line or other wiring.

Figure 7:
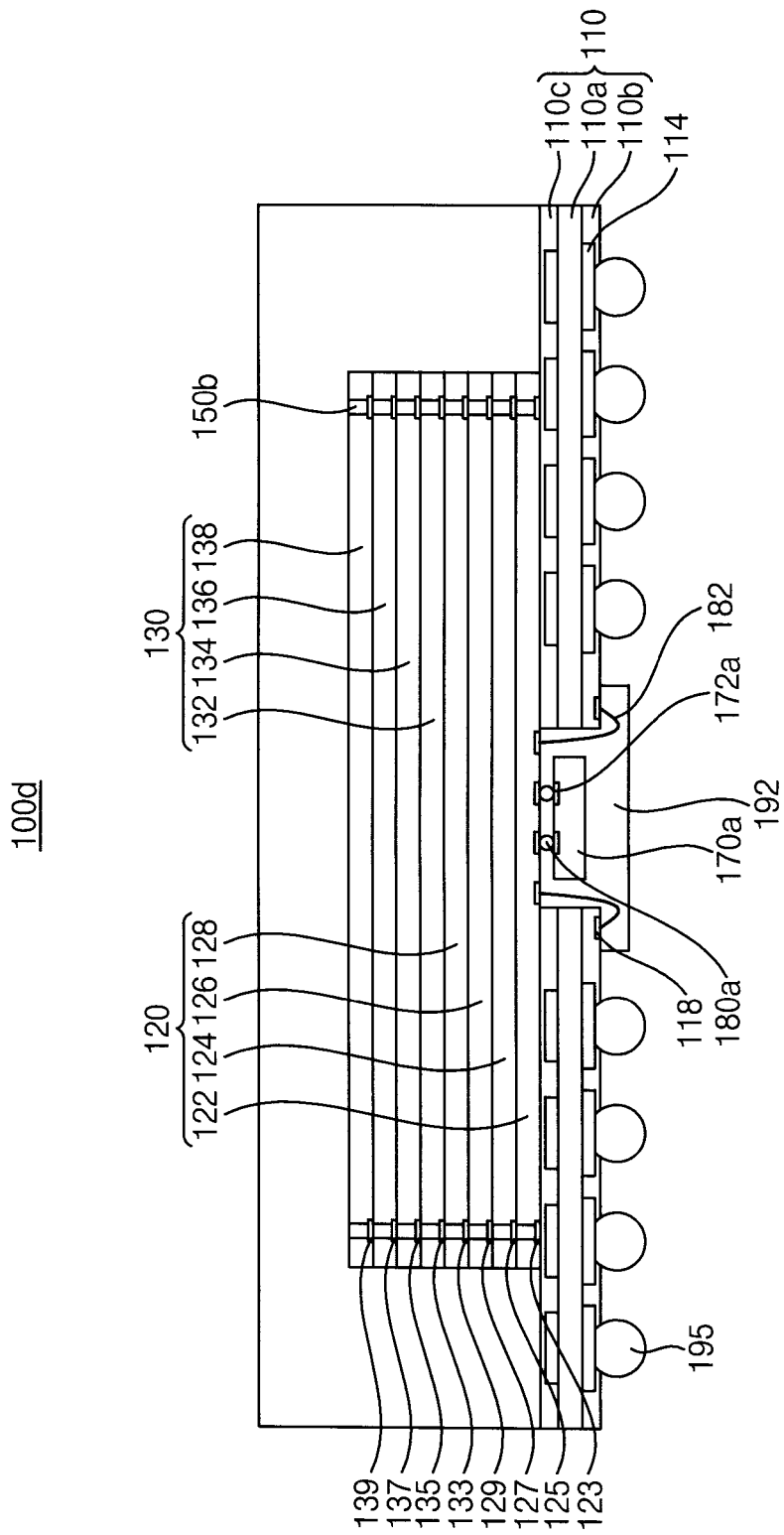

FIG. 7 is a cross-sectional view illustrating a multi-chip package in accordance with example embodiments.

A multi-chip package 100d of this example embodiment may include elements substantially the same as those of the multi-chip package 100b in FIG. 5 except for certain elements, such as the connecting substrate. Thus, the same reference numerals may refer to the same elements and any further illustrations with respect to the same elements may be omitted herein for brevity.

Referring to FIG. 7, a multi-chip package 100d of this example embodiment may not include the connecting substrate. Thus, the lower surface of the first semiconductor chip 122 as an active face of the first semiconductor chip 122 may be exposed through the opening 116 of the package substrate 110. The logic chip 170 may be electrically connected with the active face of the first semiconductor chip 122 via the conductive bump 180a.

Figure 8:
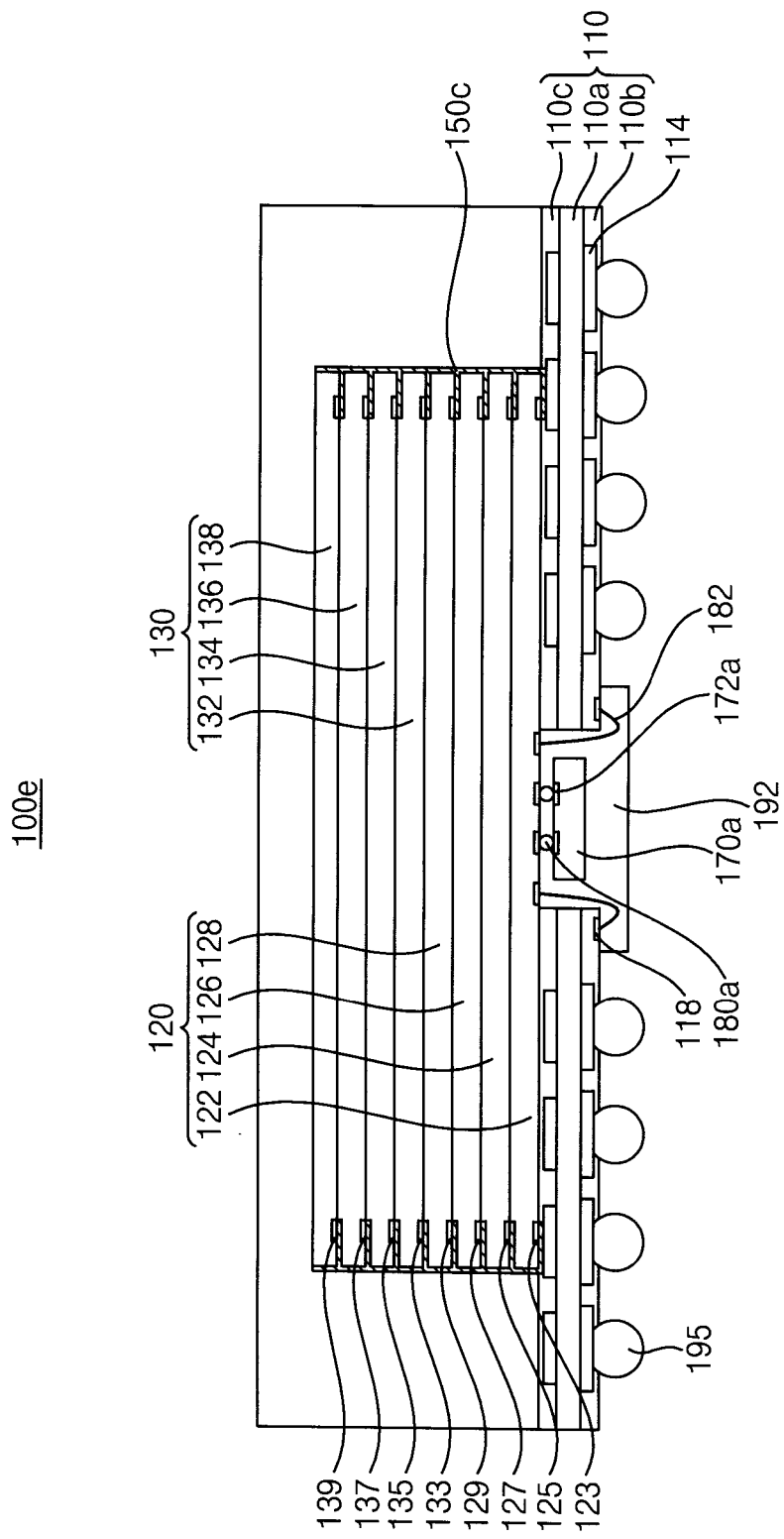

FIG. 8 is a cross-sectional view illustrating a multi-chip package in accordance with example embodiments.

A multi-chip package 100e of this example embodiment may include elements substantially the same as those of the multi-chip package 100c in FIG. 6 except for certain elements, such as the connecting substrate. Thus, the same reference numerals may refer to the same elements and any further illustrations with respect to the same elements may be omitted herein for brevity.

Referring to FIG. 8, a multi-chip package 100e of this example embodiment may not include the connecting substrate. Thus, the lower surface of the first semiconductor chip 122 as an active face of the first semiconductor chip 122 may be exposed through the opening 116 of the package substrate 110. The logic chip 170 may be electrically connected with the active face of the first semiconductor chip 122 via the conductive bump 180a.

Figure 9:
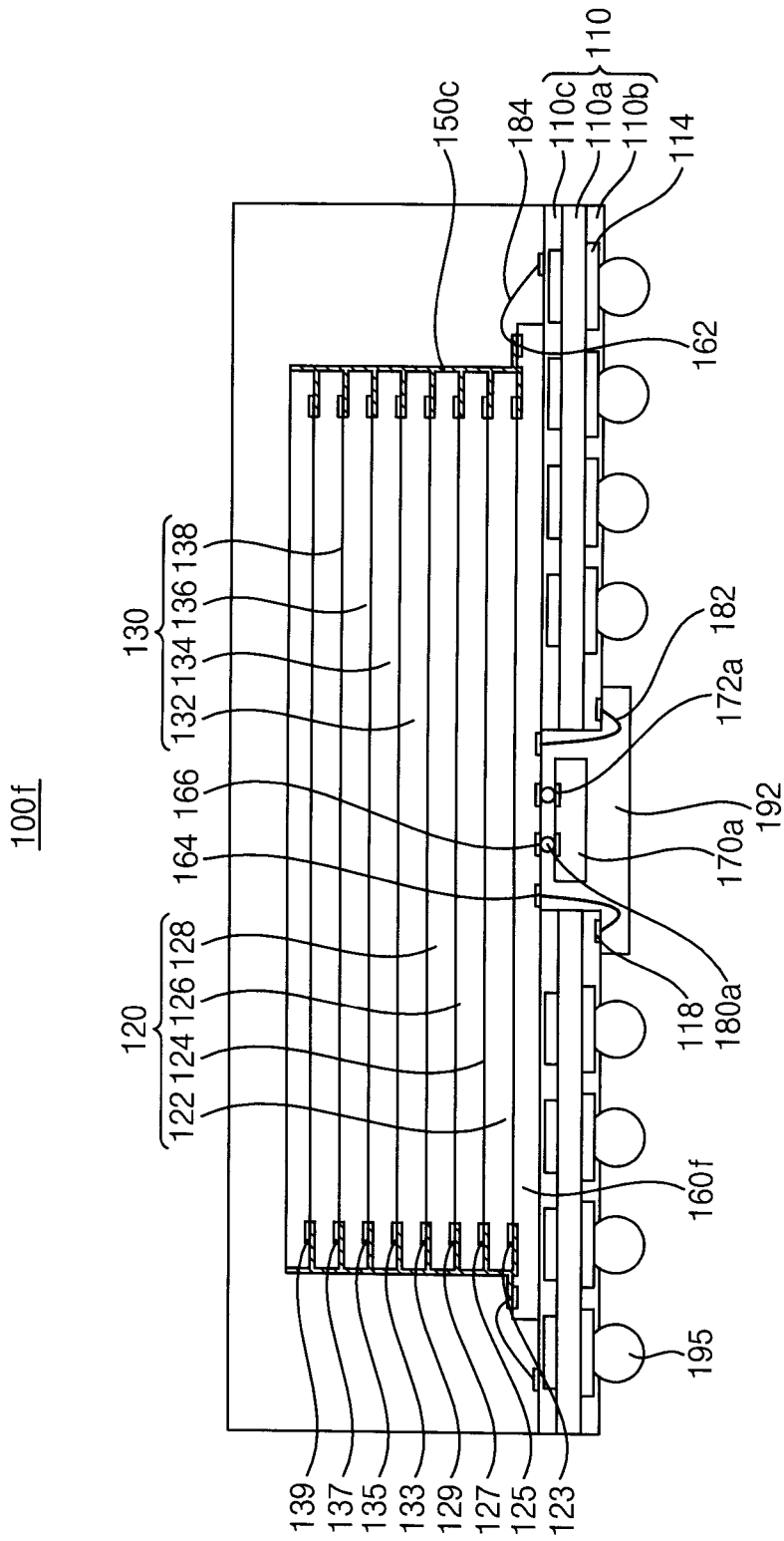

FIG. 9 is a cross-sectional view illustrating a multi-chip package in accordance with example embodiments.

A multi-chip package 100f of this example embodiment may include elements substantially the same as those of the multi-chip package 100c in FIG. 6 except for certain elements, such as a connecting substrate. Thus, the same reference numerals may refer to the same elements and any further illustrations with respect to the same elements may be omitted herein for brevity.

Referring to FIG. 9, a connecting substrate 160f may have a width greater than that of the first and second groups of the semiconductor chips 120 and 130 in a horizontal direction. Thus, the first connecting pad 162 may be exposed in the vertical direction. The first connecting pad 162 may be electrically connected with the package substrate 110 via the third connecting wire 184.

Figure 10:
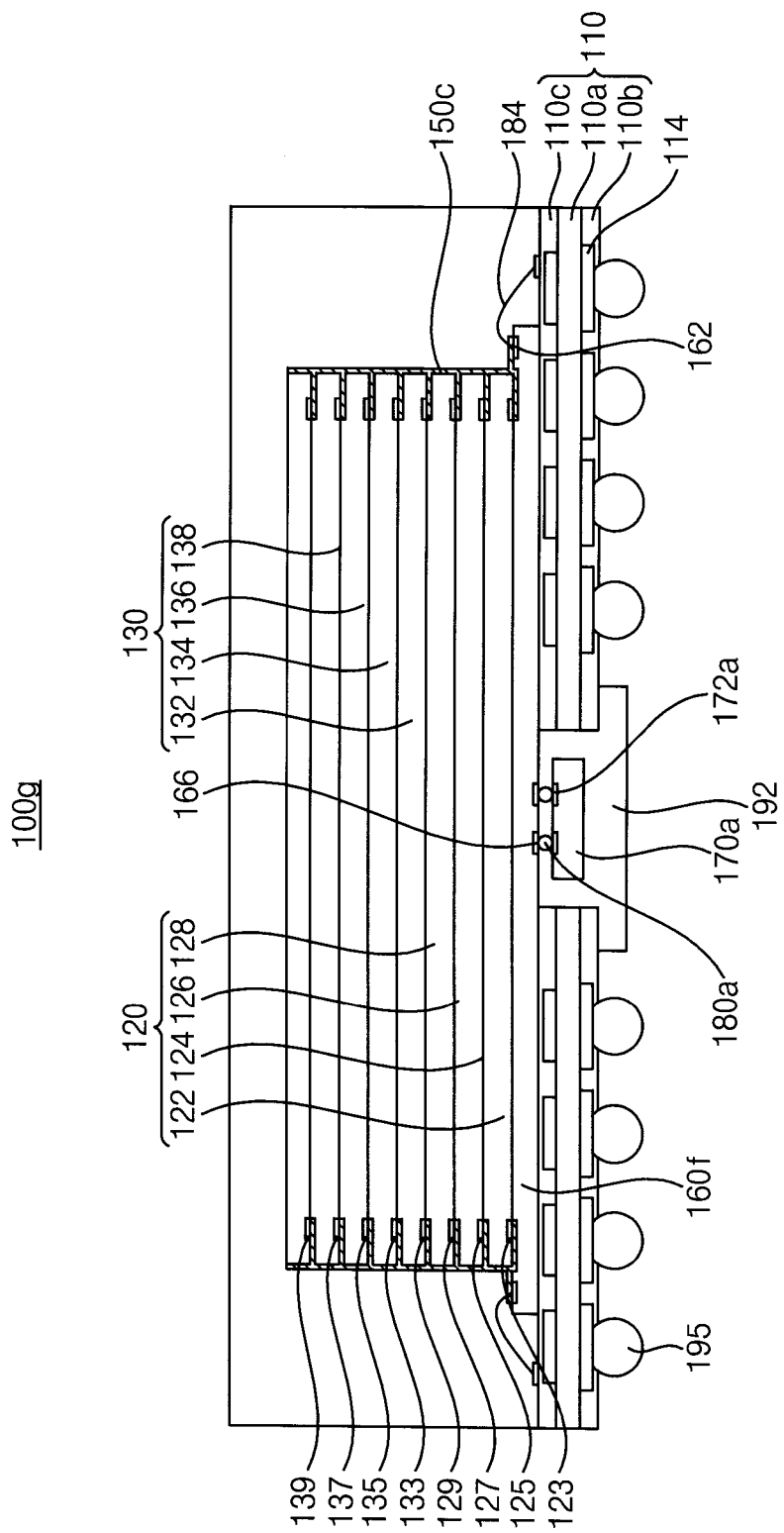

FIG. 10 is a cross-sectional view illustrating a multi-chip package in accordance with example embodiments.

A multi-chip package 100g of this example embodiment may include elements substantially the same as those of the multi-chip package 100f in FIG. 9 except for not including a second connecting wire. Thus, the same reference numerals may refer to the same elements and any further illustrations with respect to the same elements may be omitted herein for brevity.

Referring to FIG. 10, the logic chip 170a may not be electrically connected with the package substrate 110 via the second connecting wire. In example embodiments, the logic chip 170a may be electrically connected with the package substrate 110 via the connecting substrate 160f.

Figure 11:
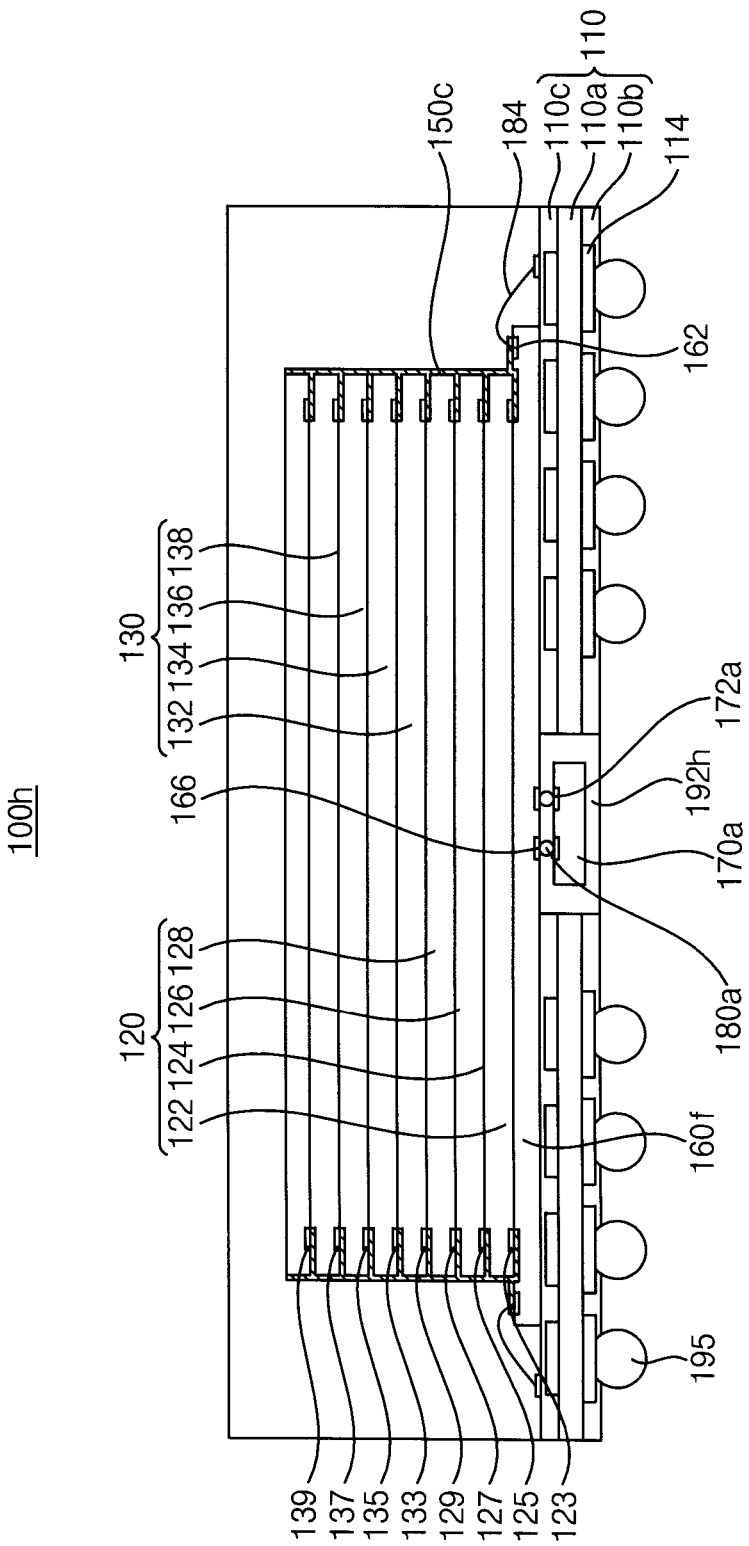

FIG. 11 is a cross-sectional view illustrating a multi-chip package in accordance with example embodiments.

A multi-chip package 100h of this example embodiment may include elements substantially the same as those of the multi-chip package 100g in FIG. 10 except for an underfilling layer. Thus, the same reference numerals may refer to the same elements and any further illustrations with respect to the same elements may be omitted herein for brevity.

Referring to FIG. 11, an underfilling layer 192h may have a lower surface substantially coplanar with the lower surface of the package substrate 110. Thus, the underfilling layer 192h may not protrude from the lower surface of the package substrate 110.

Figure 12:
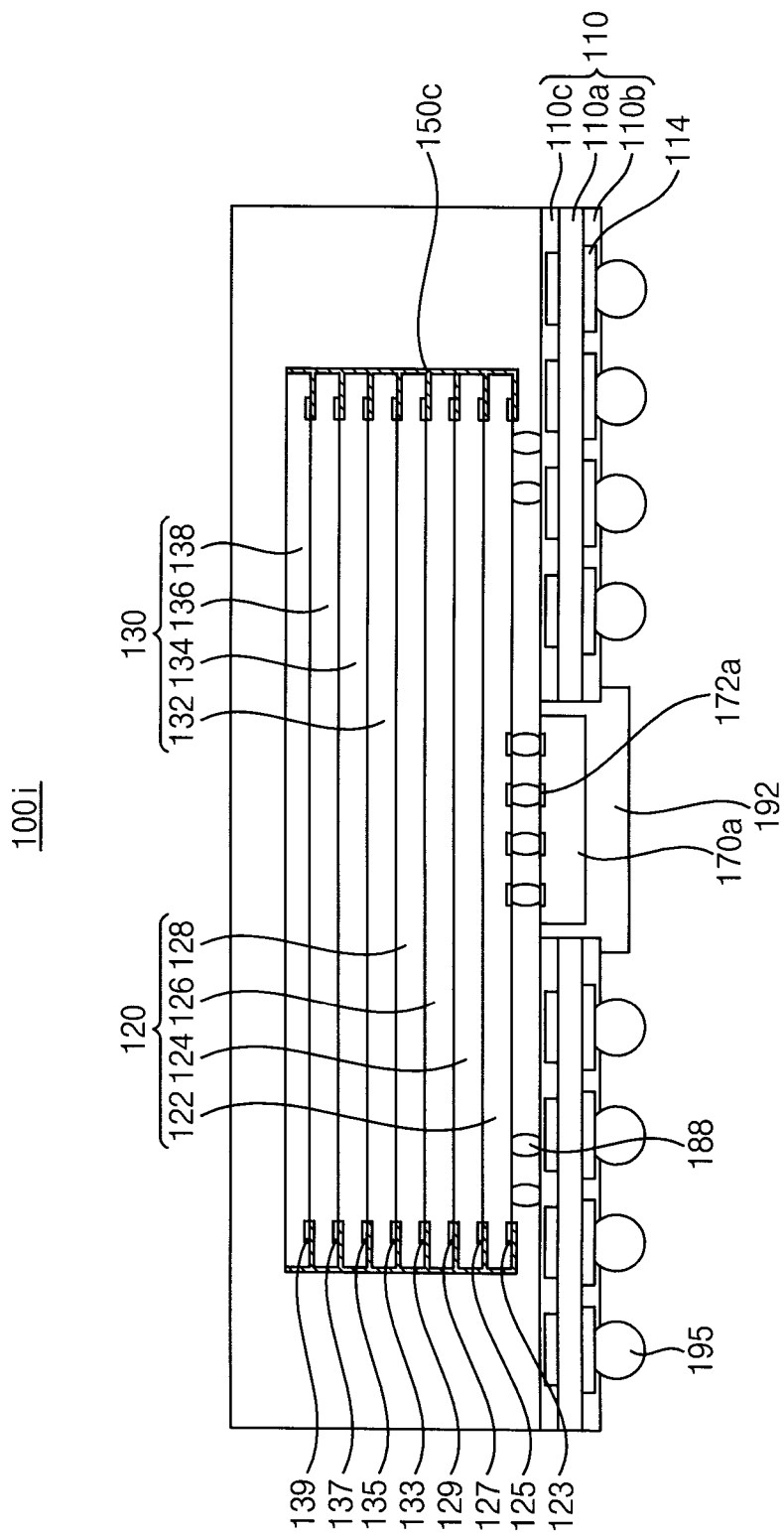

FIG. 12 is a cross-sectional view illustrating a multi-chip package in accordance with example embodiments.

A multi-chip package 100i of this example embodiment may include elements substantially the same as those of the multi-chip package 100e in FIG. 8 except for certain features, such as further including a connecting bump. Thus, the same reference numerals may refer to the same elements and any further illustrations with respect to the same elements may be omitted herein for brevity.

Referring to FIG. 12, a connecting bump 188 may be interposed between the first semiconductor chip 122 and the package substrate 110. The connecting bump 188 may be electrically connected between the first semiconductor chip 122 and the package substrate 110.

In example embodiments, the logic chip 170a may not be electrically connected with the package substrate 110 via the second connecting wire. Rather, the logic chip 170a may be electrically connected with the package substrate 110 via the first semiconductor chip 122 and additional connection bumps extending between the logic chip 170a and the first semiconductor chip 122.

Figure 13:
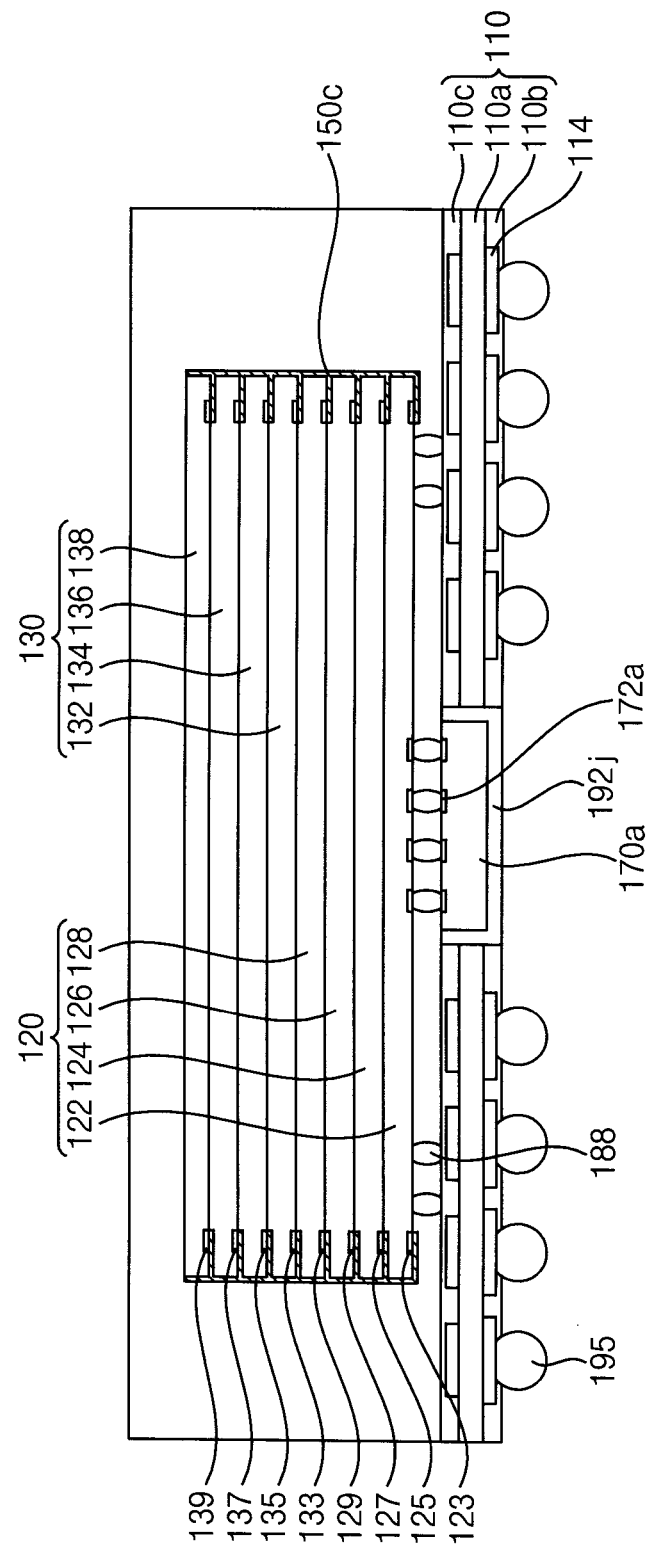

FIG. 13 is a cross-sectional view illustrating a multi-chip package in accordance with example embodiments.

A multi-chip package 100j of this example embodiment may include elements substantially the same as those of the multi-chip package 100i in FIG. 12 except for an underfilling layer. Thus, the same reference numerals may refer to the same elements and any further illustrations with respect to the same elements may be omitted herein for brevity.

Referring to FIG. 13, an underfilling layer 192j may have a lower surface substantially coplanar with the lower surface of the package substrate 110. Thus, the underfilling layer 192j may not protrude from the lower surface of the package substrate 110.

Figure 14:
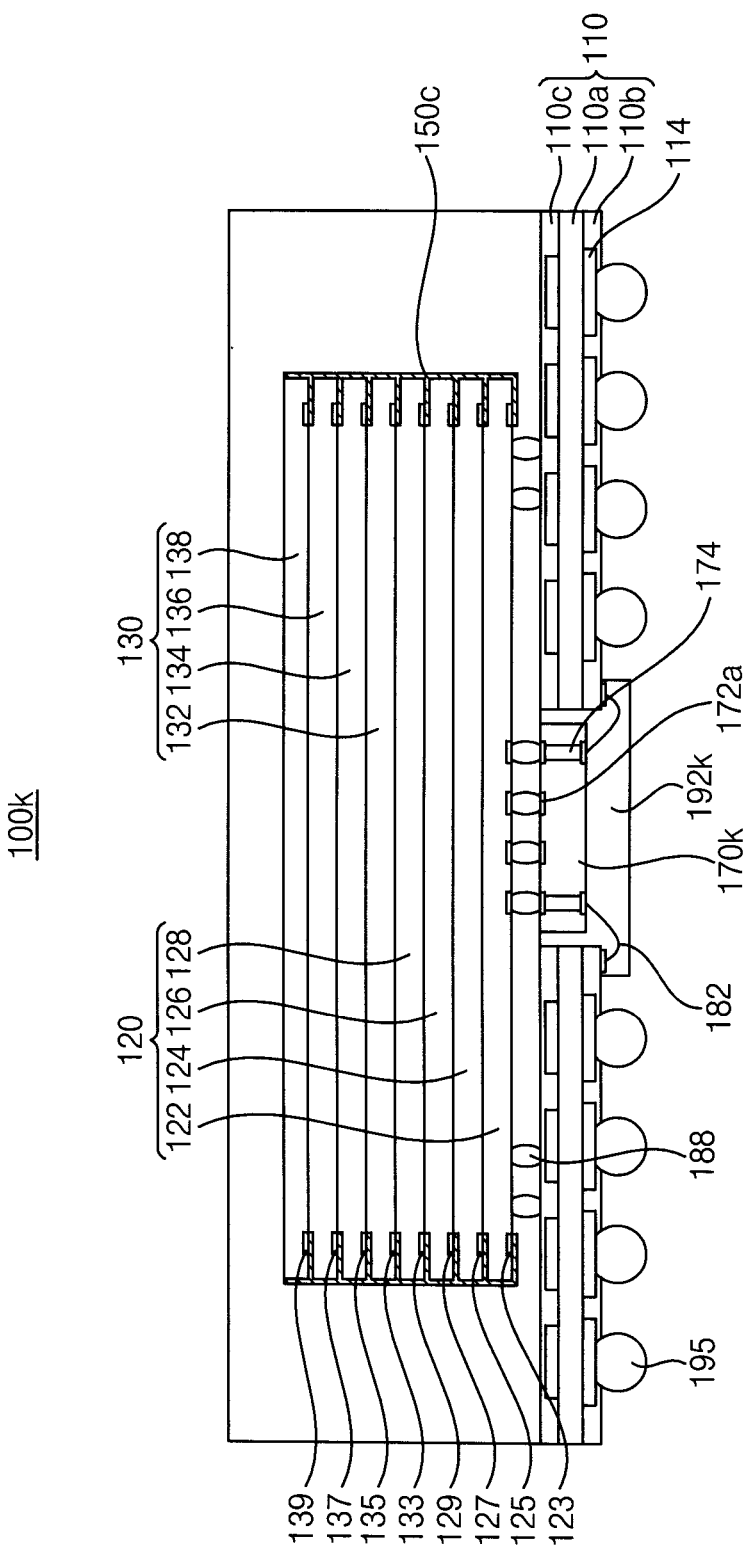

FIG. 14 is a cross-sectional view illustrating a multi-chip package in accordance with example embodiments.

A multi-chip package 100k of this example embodiment may include elements substantially the same as those of the multi-chip package 100i in FIG. 12 except for a logic chip and certain connections thereto. Thus, the same reference numerals may refer to the same elements and any further illustrations with respect to the same elements may be omitted herein for brevity.

Referring to FIG. 14, a logic chip 170k may further include a logic plug 174. The logic plug 174 may be formed in the logic chip 170k. The logic plug 174 may have an upper end electrically connected to the conductive bumps 180a, and a lower end exposed through a lower surface of the logic chip 170k. The second connecting wire 182 may be electrically connected to the lower end of the logic plug 174.

In example embodiments the multi-chip package may include the two groups of the semiconductor chips or the four groups of the semiconductor chips. Alternatively, the multi-chip package may include three groups of semiconductor chips or at least five groups of semiconductor chips.

According to example embodiments, the logic chip may be positioned in the opening of the package substrate. Further, the logic chip may be electrically connected with the semiconductor chips via the connecting substrate. Thus, the logic chip may not increase a width of the multi-chip package. As a result, the multi-chip package may have a narrow width and a thin thickness.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-chip package comprising:
   a package substrate including an opening therein;
   an interposer disposed on the package substrate to cover the opening;
   a stack of semiconductor chips disposed on a first surface of the interposer;
   a logic chip disposed in the opening and on a second surface of the interposer opposite the first surface; and
   a first logic pad on a surface of the logic chip and electrically connected to a second pad of the interposer located at the opening, the second pad electrically connected to the stack of semiconductor chips,
   wherein the logic chip electrically connects to the stack of semiconductor chips through the interposer and also includes direct electrical connections to the package substrate that do not pass through the interposer.

2. The multi-chip package of claim 1, wherein the stack of semiconductor chips comprises a first group of semiconductor chips and a second group of semiconductor chips; wherein:
   the first group of semiconductor chips is directly electrically connected to the interposer without being connected through the package substrate; and
   the second group of semiconductor chips is directly electrically connected to the package substrate.

3. The multi-chip package of claim 1, further comprising:
   a pad on a bottom surface of the interposer and directly electrically connected to the logic chip; and
   a pad on a top surface of the interposer and directly electrically connected to at least a first semiconductor chip of the stack of semiconductor chips.

4. The multi-chip package of claim 3, further comprising:
   a pad on a top surface of the interposer that is directly electrically connected to the package substrate.

5. The multi-chip package of claim 3, wherein the second pad located at the opening is the same pad as the pad on the bottom surface of the interposer.

* * * * *